(12) United States Patent
Christensen (10) Patent No.: US 9,466,145 B2
(45) Date of Patent: Oct. 11, 2016

(54) IDENTIFICATION OF VASCULAR TERRITORIES

(71) Applicant: The University of Melbourne, Victoria (AU)

(72) Inventor: Soren Christensen, Victoria (AU)

(73) Assignee: The University of Melbourne (AU)

( * ) Notice: Subject to any disclaimer, the term of this patent is extended or adjusted under 35 U.S.C. 154(b) by 0 days.

(21) Appl. No.: 14/396,871

(22) PCT Filed: Apr. 24, 2013

(86) PCT No.: PCT/AU2013/000424
§ 371 (c)(1),
(2) Date: Oct. 24, 2014

(87) PCT Pub. No.: WO2013/159147
PCT Pub. Date: Oct. 31, 2013

(65) Prior Publication Data
US 2015/0125058 A1     May 7, 2015

(30) Foreign Application Priority Data

Apr. 24, 2012   (AU) ................................ 2012901613

(51) Int. Cl.
| | |
|---|---|
| *G06K 9/00* | (2006.01) |
| *G06T 15/08* | (2011.01) |
| *G06T 7/00* | (2006.01) |
| *G01R 33/563* | (2006.01) |

(52) U.S. Cl.
CPC ......... *G06T 15/08* (2013.01); *G01R 33/56366* (2013.01); *G06T 7/0081* (2013.01); *G06T 2200/04* (2013.01); *G06T 2207/10081* (2013.01); *G06T 2207/10088* (2013.01); *G06T 2207/20101* (2013.01); *G06T 2207/20141* (2013.01); *G06T 2207/20148* (2013.01); *G06T 2207/30016* (2013.01); *G06T 2207/30101* (2013.01); *G06T 2207/30104* (2013.01); *G06T 2210/41* (2013.01)

(58) Field of Classification Search
CPC ................................ G06T 15/08; G06T 7/00
USPC ........................................................ 382/131
See application file for complete search history.

(56) References Cited

U.S. PATENT DOCUMENTS

| | | | |
|---|---|---|---|
| 7,817,831 B2 * | 10/2010 | Scheuering ........... | G06T 7/0081 382/128 |
| 2008/0232666 A1 * | 9/2008 | Rottger ........................ | 382/131 |
| 2012/0041319 A1 | 2/2012 | Taylor et al. | |

FOREIGN PATENT DOCUMENTS

| | | |
|---|---|---|
| WO | WO03/046812 | 6/2003 |

OTHER PUBLICATIONS

International Search Report and Written Opinion, PCT/AU2013/000424, Jun. 25, 2013, 7 pages.

*Primary Examiner* — Gregory F Cunningham
(74) *Attorney, Agent, or Firm* — Fish & Richardson P.C.

(57) ABSTRACT

A computer-implemented method of identifying vascular territories in an imaging volume representing an anatomical region, including: obtaining, for each volume element of a plurality of volume elements into which the imaging volume is divided, arrival time data representing an estimated arrival time of a contrast agent at the volume element; defining one or more seed regions, each seed region associated with one of a plurality of vascular territories and containing seed volume elements for which the estimated arrival time does not exceed a threshold time; identifying, on the basis of the arrival time data, unassigned elements of the plurality of volume elements which are connected with a seed volume element; and assigning said unassigned elements of the plurality of volume elements to one of said vascular territories.

17 Claims, 7 Drawing Sheets

IDENTIFICATION OF VASCULAR TERRITORIES

CLAIM OF PRIORITY

This application is a national stage of and claims priority under 35 U.S.C. §371 to PCT Application No. PCT/AU2013/000424, filed on Apr. 24, 2013, which claims priority to Australian Application No. 2012901613, filed on Apr. 24, 2012. The contents of both of these priority applications are hereby incorporated by reference in their entirety.

TECHNICAL FIELD

The present invention relates to a system and method for identification of vascular territories. It is particularly, though not exclusively, applicable in identifying cerebral vascular territories from dynamic CT and MRI perfusion studies.

BACKGROUND

Dynamic CT (computed tomography) and MRI (magnetic resonance imaging) perfusion studies are both established techniques to assess hemodynamic parameters in the brain and other organs. Typically, a contrast agent (also known as an imaging agent, indicator or tracer agent) is injected into the venous circulation and the passage of the contrast agent is imaged at discrete times using either CT or MRI. For example, a typical scan may consist of imaging discrete "slices" of predetermined thickness through a brain every 1-2 seconds for 1-2 minutes. This way of imaging the bolus passage is often referred to as bolus tracking.

The usual result of the imaging process is a four-dimensional data set representing an intensity value for each voxel (discretised volume element) of the scan volume at each discrete time. The intensity value can be used to infer the concentration of contrast agent at each time point. The nature of this intensity to concentration mapping depends on the imaging modality and imaging protocol used.

The concentration estimates thus obtained can be used to infer the pathway of flow through the scan volume. An estimate of relative arrival time (also referred to in the art as delay time) of the bolus (contrast agent) at each voxel can be obtained from the concentration data for the voxel, for example by one of the methods described in: Christensen et al. (2008), "Inferring origin of vascular supply from tracer arrival timing patterns using bolus tracking MRI", *Journal of Magnetic Resonance Imaging* 27, 1371-1381, the contents of which are hereby incorporated by reference.

The tracking approach outlined by Christensen et al. can be effective in characterising flow in the periphery of the vasculature, where blood flow velocity is lower and delay differences between adjacent voxels are consequently larger. However, it is impractical in characterising flow in the large cerebral arteries. Blood flow velocity in the large cerebral arteries is on the order of 50 cm/s, translating into arrival time differences of approximately 4 ms between two adjacent voxels which are spaced 2 mm apart (such spacings being typical in the art). These arrival time differences are orders of magnitude lower than the sampling rates of 1-2 s presently used in bolus tracking, and thus, may be difficult or impossible to characterise directly using previously known methods.

It would be desirable to overcome or alleviate the limitations with known methods as described above, or at least to provide a useful alternative.

SUMMARY OF THE INVENTION

In a first aspect, the present invention provides a computer-implemented method of identifying vascular territories in an imaging volume representing an anatomical region, including:
  obtaining, for each volume element of a plurality of volume elements into which the imaging volume is divided, arrival time data representing an estimated arrival time of a contrast agent at the volume element;
  defining one or more seed regions, each seed region associated with one of a plurality of vascular territories and containing seed volume elements for which the estimated arrival time does not exceed a threshold time;
  identifying, on the basis of the arrival time data, unassigned elements of the plurality of volume elements which are connected with a seed volume element; and
  assigning said unassigned elements of the plurality of volume elements to one of said vascular territories.

By applying an upper threshold to the arrival time data, it is possible to identify the volume elements which have the earliest arrival times, and which are therefore most likely to be associated with large arteries which are sources of blood flow in the anatomical region of interest. The seed volume elements thereby identified can then be used to segment the imaging volume into regions, each region being associated with a putative large artery (proximal vasculature). This is in contrast to known methods, which start in the peripheral vasculature and end at a medium-sized vessel.

The method may include assigning a label to each said seed region.

In certain embodiments, said defining includes accepting input data from a user. For example, the method may include providing a user interface which presents a map of the arrival time data to the user, and controls for interacting with the map. This permits the user to visualise volume elements which pass the currently defined time threshold. The time threshold can be adjusted using the controls so that the visualisation can be changed in real time. Then, the user can define one or more of the seed regions, for example by selecting one or more volume elements belonging to a region containing a plurality of connected elements, and defining a region label (e.g., based on the anatomical region to which the elements belong).

In certain embodiments, a seed region or group of seed regions may act as a seed for a region growing or other agglomerative or aggregative segmentation method.

It will also be appreciated that a multitude of other segmentation methods known in the art are possible, either individually or in combination. For example, the segmentation may be achieved through the use of watershed type algorithms, level sets, developing contours and other algorithms that accomplish region growing in a scalar volume.

The method may include using prior information (for example, prior anatomical information) to constrain the assigning of unassigned elements. The prior information may include information relating to segregation of blood flow in the anatomical region. So, for example, if the imaging volume represents data from a brain CT or MRI scan, it is known a priori that tissue in one hemisphere cannot be fed by vessels in the opposite hemisphere except for at the level of the Circle of Willis. Accordingly, a volume element in one hemisphere should not be associated with a seed volume element in the opposite hemisphere except for at select known locations.

Certain embodiments of the method may include:
(i) incrementing the threshold time to obtain an updated threshold;
(ii) identifying unassigned volume elements having estimated arrival times less than the updated threshold;
(iii) assigning said unassigned volume elements to one of said vascular territories; and
(iv) repeating (i) to (iii) until a maximum threshold is reached.

In certain embodiments, the anatomical region is brain.

The arrival time data may be derived from CT or MRI scans of a subject, for example.

In another aspect, the present invention provides a system for identifying vascular territories in an imaging volume representing an anatomical region, including at least one processor configured to perform the steps of any of the above methods.

In a further aspect, the present invention provides a computer-readable medium containing computer program instructions which, when executed by at least one processor, cause the at least one processor to perform the method of any of the above embodiments.

In a yet further aspect, the invention provides a system for identifying vascular territories in an imaging volume representing an anatomical region, including:
pre-processing means for obtaining, for each volume element of a plurality of volume elements into which the imaging volume is divided, arrival time data representing an estimated arrival time of a contrast agent at the volume element;
seeding means for defining one or more seed regions, each seed region associated with one of a plurality of vascular territories and containing seed volume elements for which the estimated arrival time does not exceed a threshold time;
identifying means for identifying, on the basis of the arrival time data, unassigned elements of the plurality of volume elements which are connected with a seed volume element; and
assigning means for assigning said unassigned elements of the plurality of volume elements to one of said vascular territories.

The seeding means may include input means for accepting input data from a user to define said one or more seed regions.

In certain embodiments, said assigning includes applying region-growing to said seed region or regions.

The system may further include means for:
(i) incrementing the threshold time to obtain an updated threshold;
(ii) identifying unassigned volume elements having estimated arrival times less than the updated threshold;
(iii) assigning said unassigned volume elements to one of said vascular territories; and
(iv) repeating (i) to (iii) until a maximum threshold is reached.

In certain embodiments, the system includes means for constraining said assigning on the basis of prior information. The prior information may include information relating to segregation of blood flow in the anatomical region.

In certain embodiments, the anatomical region is brain.

The system may further include a medical imaging apparatus for obtaining imaging data from a subject, the arrival time data being derived from the imaging data. The medical imaging apparatus may be a CT scanner or MRI scanner.

BRIEF DESCRIPTION OF THE DRAWINGS

Embodiments of the invention will now be described, by way of non-limiting example only, with reference to the accompanying drawings in which.

DETAILED DESCRIPTION

Figure 1:
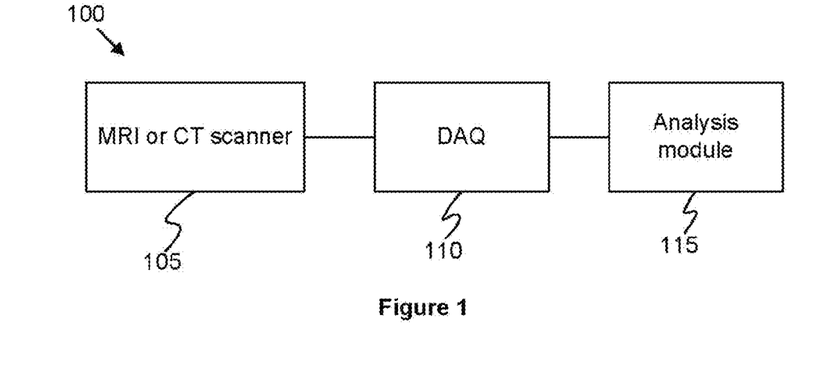
FIG. 1 is a schematic of a system for acquiring scan data and analysing it to identify vascular territories.

FIG. 1 schematically depicts a system 100 for identifying vascular territories. The system 100 will be specifically described with reference to its use in mapping vascular territories of the brain, but it will be appreciated by the skilled person that the process may also be applicable to other anatomical structures including organs, organ systems or tissues.

Figure 2:
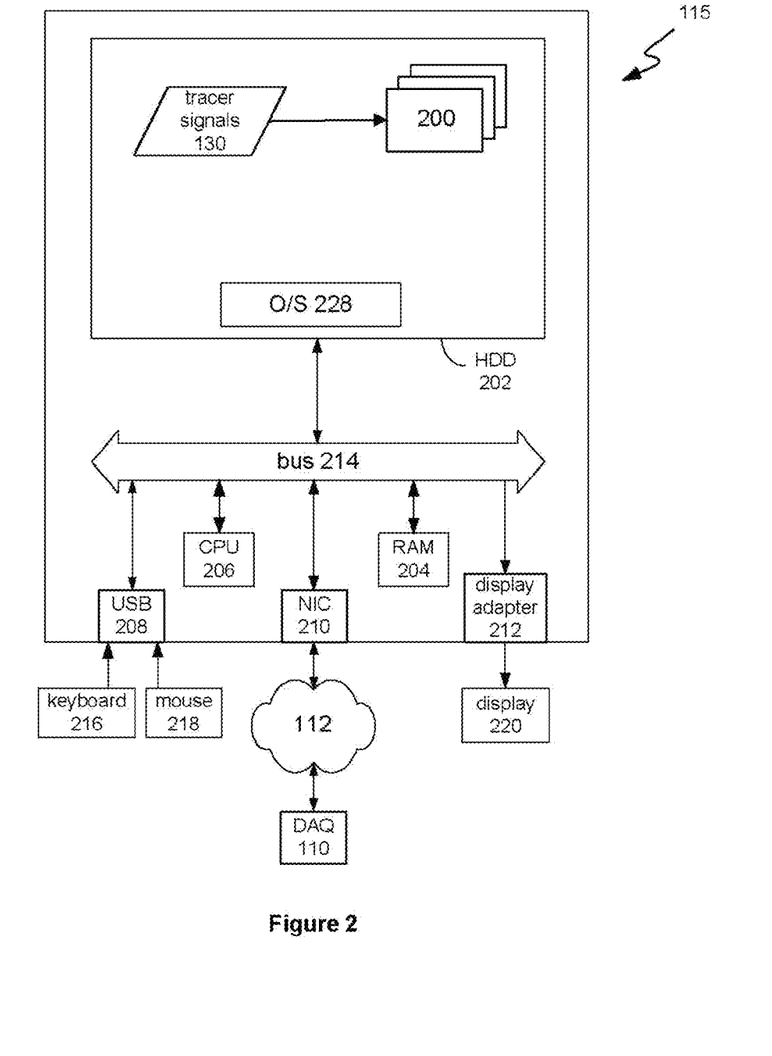
FIG. 2 is a schematic of an exemplary computer system for identifying vascular territories.

In the described embodiments, the system 100 includes an MRI or CT scanner 105, a data acquisition module 110 and an analysis module 115, shown in more detail in FIG. 2. In other embodiments an alternative imaging system such as a SPECT or PET system may be substituted for the MRI or CT scanner 105.

The processes of the described embodiments are implemented as one or more software modules executed by a standard personal computer system such as an Intel IA-32 based computer system, as shown in FIG. 2. However, it will be apparent to those skilled in the art that at least parts of the processes could alternatively be implemented in part or entirely in the form of one or more dedicated hardware components, such as application-specific integrated circuits (ASICs) and/or field programmable gate arrays (FPGAs), for example.

Figure 3:
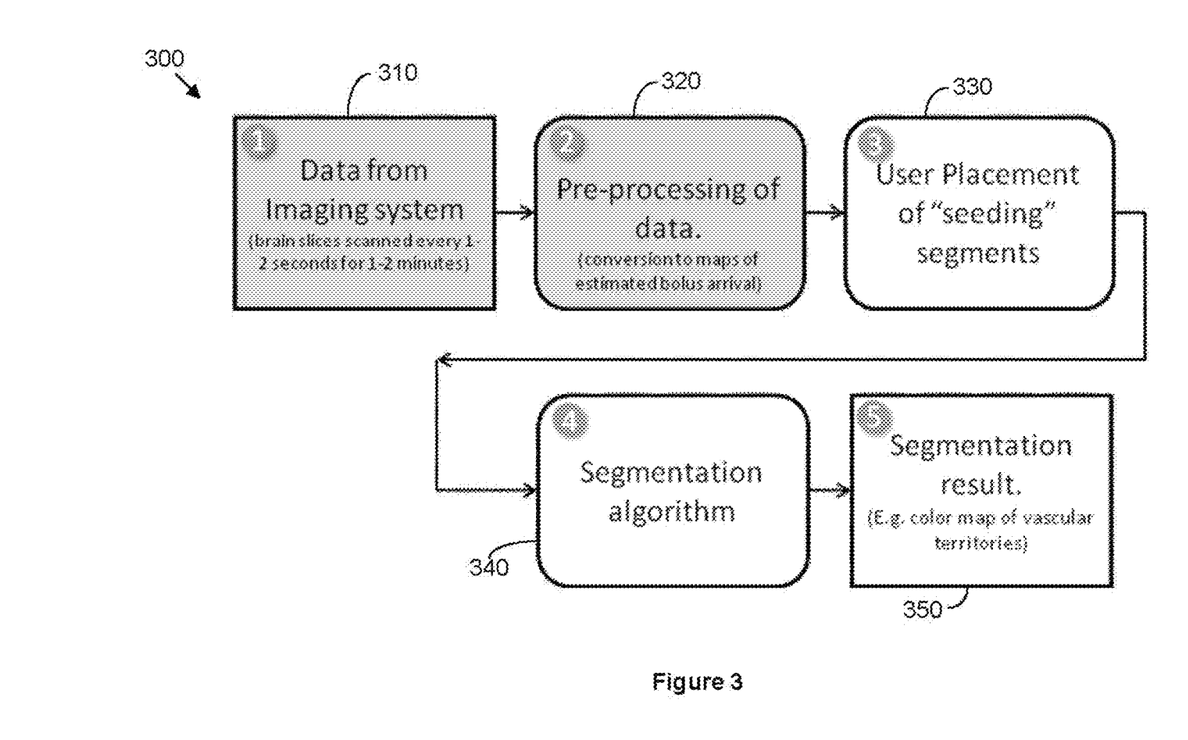
FIG. 3 is a flow diagram of an exemplary vascular territory mapping process executed by the system of FIG. 2.
Figure 5:
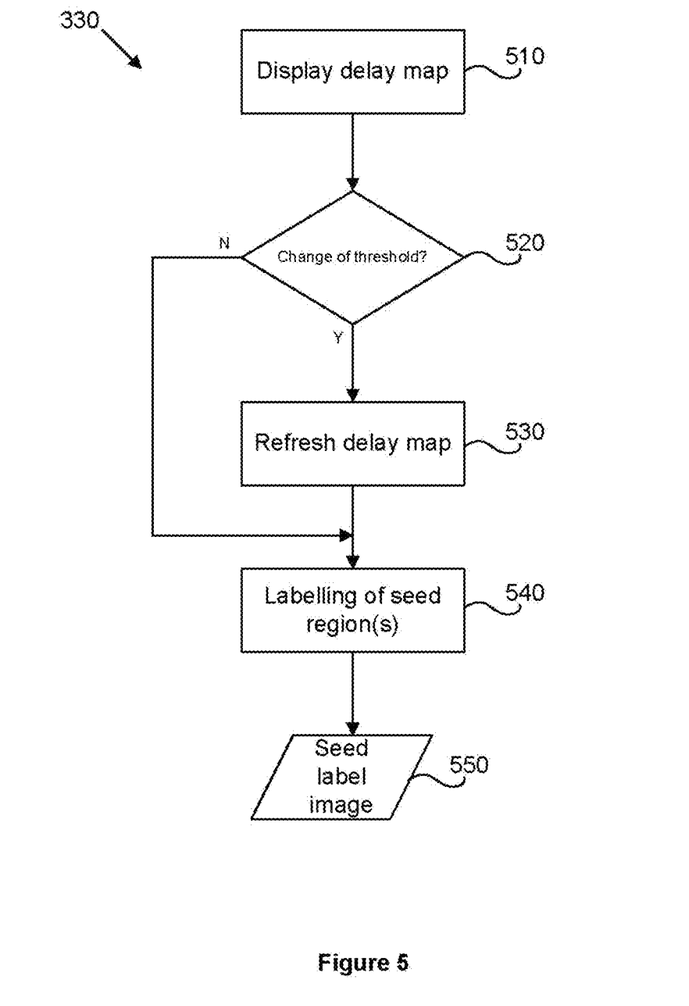
FIG. 5 is a flow diagram of a seeding process of the vascular territory mapping process of FIG. 3.
Figure 7:
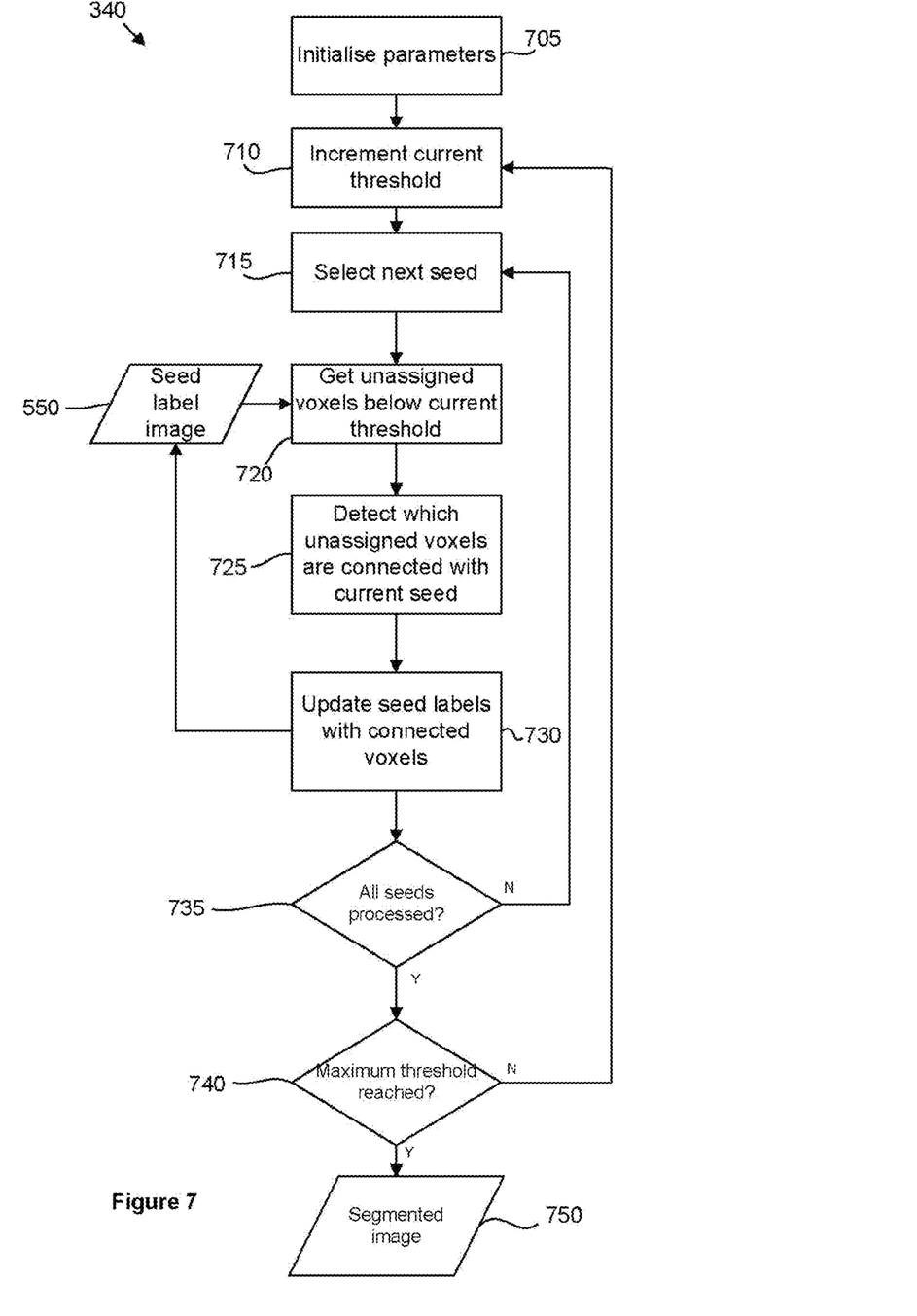
FIG. 7 is a flow diagram of a segmentation process of the vascular territory mapping process of FIG. 3.

As shown in FIG. 2, an analysis module 115 executes a process 300, as shown in FIGS. 3, 5 and 7, which is implemented as one or more software modules 200 stored on non-volatile (e.g., hard disk or solid-state drive) storage 202 associated with a standard computer system. The system 115 includes standard computer components, including random access memory (RAM) 204, at least one processor 206, and external interfaces 208, 210, 212, all interconnected by a bus 214. The external interfaces include universal serial bus (USB) interfaces 208, at least one of which is connected to a keyboard 218 and a pointing device such as a mouse 216, a network interface connector (NIC) 210 which can be used to connect the system 115 to a communications network 112, and a display adapter 212, which is connected to a display device such as an LCD panel display 220. The system 100 also includes a number of standard software modules, including an operating system 228 such as Linux or Microsoft Windows. The system 115 communicates with data acquisition module 110 over communications network 112 in order to receive input data from scans conducted by MRI or CT scanner 105.

As shown in FIG. 3, CT or MRI scan data 310 is used as an input to the process 300, having been acquired from a subject (by scanner 105 and data acquisition module 110) following injection of a bolus (contrast agent) into the subject. Brain slices having a thickness in the range 0.5 mm to 5 mm are each scanned at a frequency (the sampling rate) in the range 1-2 seconds, over an acquisition time of approximately 1-2 minutes. It will be appreciated that slice thicknesses outside this range, specifically smaller slice thicknesses, are possible, and that a higher sampling rate and/or longer acquisition time are also possible. The data set 310 includes scalar valued data for each voxel of the imaging volume, which encompasses the brain of the subject, at a succession of times.

At block 320, pre-processing steps are undertaken on the scan data 310 in a manner which is standard in the art. The pre-processing may include segmenting brain tissue from skull and background tissue, for example by accepting user input as to an intensity threshold which separates brain from skull. The signal intensity data from the imaging device 105 is converted into concentration time curves in a manner known in the art and each temporal acquisition is then subjected in known fashion to a smoothing procedure based on its signal-to-noise ratio, for example using a Gaussian smoothing filter, or an anisotropic (ASD) or non-local means (NLD) diffusion filter. The smoothed data for each voxel is then fitted to a gamma variate function of the form:

$$C_{fitted}(t) = C_0 \cdot (t-t_d)^r \cdot e^{-(t-t_d)/b},$$

where $C_{fitted}(t)$ is the fitted value of the tracer concentration at time t, $t_d$ is a parameter representing the arrival time of the bolus, $C_0$ is a normalisation constant, and r and b are shape parameters.

The parameters from this model can be used to calculate, for each voxel, a scalar value (delay parameter) that is an approximation of the time when the tracer agent first entered the voxel. For example, as described in Christensen et al (2008), the normalised first moment FM may be taken as representative of arrival time. FM can be calculated analytically from the fitted parameters according to $FM = t_d + b \cdot (r+1)$. As an alternative delay parameter, the time to peak (TTP) has been found to be equally as effective as FM in the methods described herein, and is calculated as $TTP = t_d + b \cdot r$.

The pre-processing process 320 may tag some of the voxels in the imaging volume as excluded voxels. For example, if a voxel has a concentration v. time curve which does not leave the baseline, then this is interpreted as meaning that no tracer arrived at that voxel during the scan sequence. Additionally, if the fitting procedure described above fails for any voxels, those voxels are also tagged as excluded.

Figure 4:
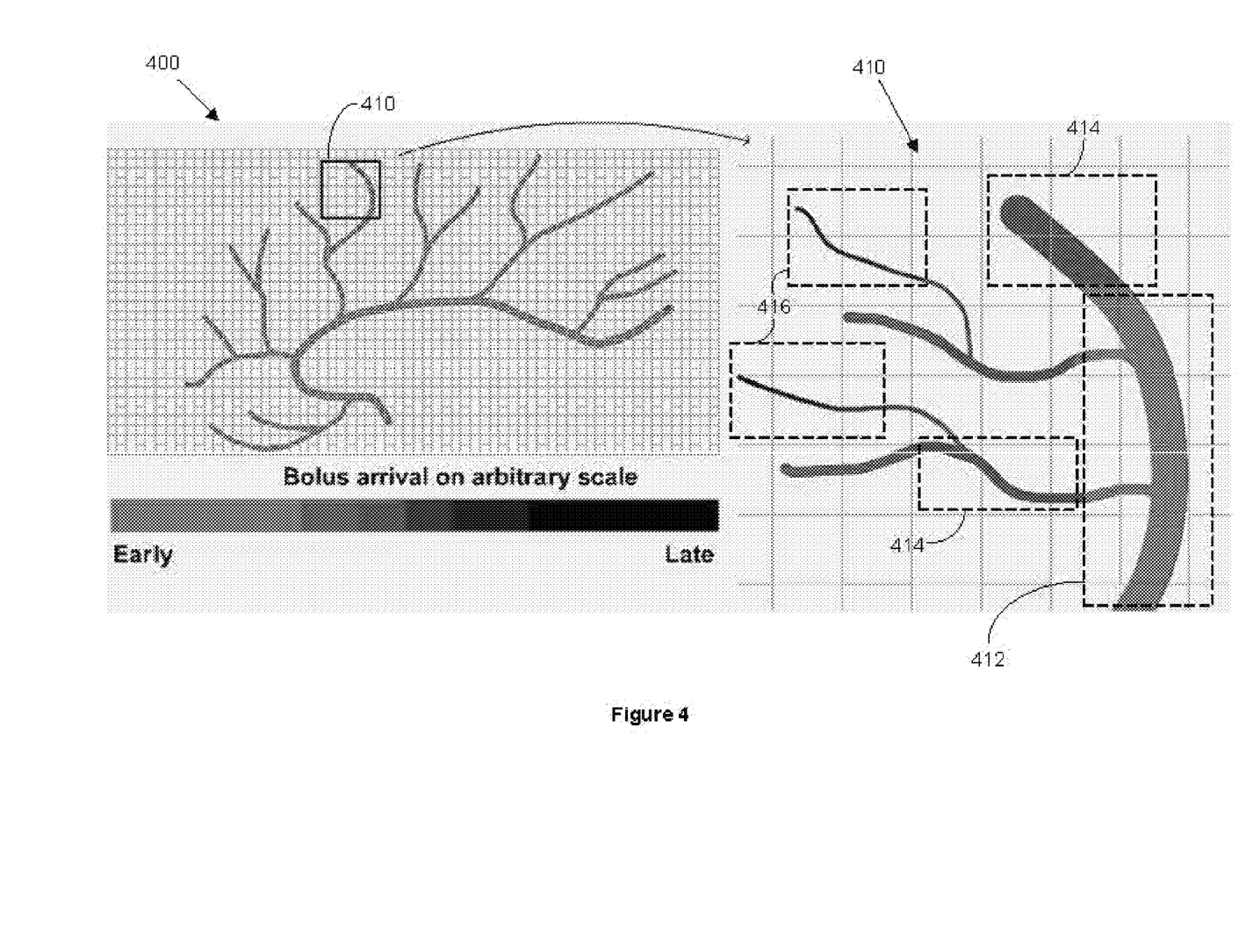
FIG. 4 is a schematic depiction of a delay map showing only major vessels.

The FM data (or other calculated and/or measured delay parameter) can be used to visualise and infer the blood flow in the imaging volume. For example, a heat map (also referred to herein as a delay map) of arrival time values as a function of spatial coordinate can be generated. An example heat map 400 is shown in highly schematic form in FIG. 4, representing a particular brain slice. In the close-up view of region 410 at the right of FIG. 4, the brightest region 412 corresponds to the earliest arrival times, slightly darker regions 414 represent slightly later arrival times, and darkest regions 416 represent the latest arrival times and correspond to the peripheral vasculature.

Next, one or more seed regions is identified in a seeding process 330, either automatically on the basis of delay parameter, or via user interaction with a delay map.

In the described embodiments, a user at computer system 115 may use mouse movements to apply a threshold to the delay map, effectively creating a dichotomized presentation (a mask) of delays smaller than the current threshold.

For example, with reference to the flow diagram of FIG. 5, seeding process 330 displays, on display 220, a delay map (which may be a map of a particular brain slice, or a perspective view of the 3D imaging volume, for example) generated using the delay parameters calculated at 320 (step 510). The seeding process 330 then accepts user input as to a time threshold for the delay parameter (step 520). The user input may be via entry (using keyboard 216) of a desired value for the current threshold into an input area of a user interface displayed on display 220, or by mouse clicks of control buttons of the user interface which increase or decrease the current threshold.

The displayed delay map may be automatically refreshed on each change of the current threshold, or on request by the user, at step 530.

Figure 6:
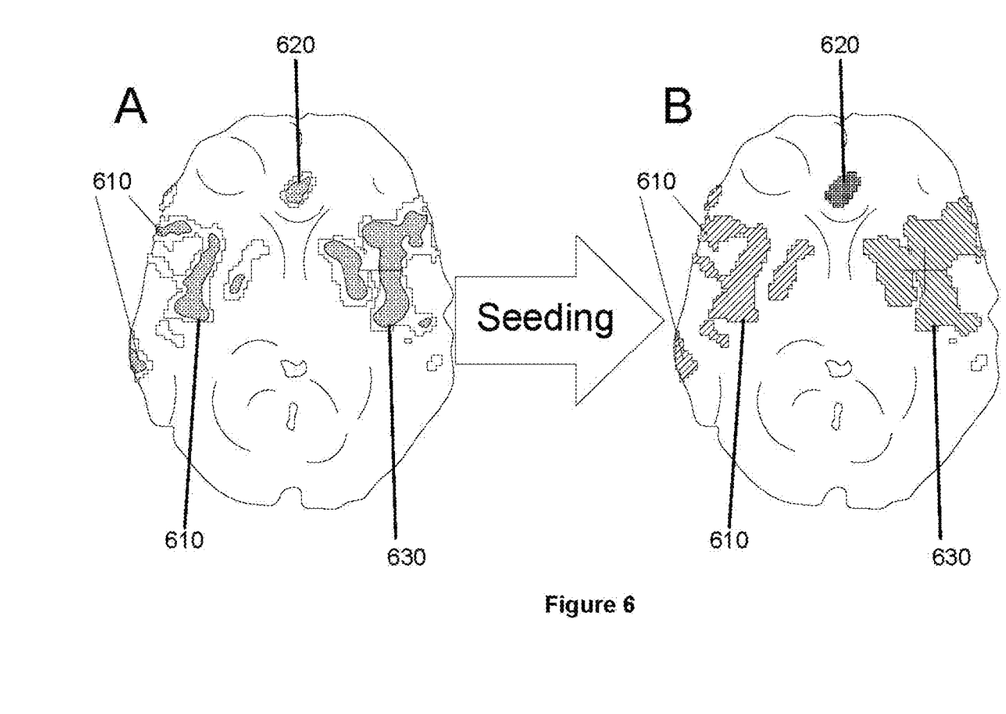
FIG. 6 illustrates an exemplary result of the seeding process of FIG. 5.

In this way, the user can identify a threshold below which only voxels associated with the proximal feeding vessels should be seen. For example, the delay map can be registered to an anatomical image of the organ being imaged, as shown in FIG. 6. As the user adjusts the delay threshold as described above, it will be apparent from the user's knowledge of the anatomy of the organ that a particular chosen delay threshold has captured only voxels of the proximal feeding vessels. Once this threshold is identified, each contiguous region containing those voxels can be defined by the seeding process 330 as a seed region.

In certain embodiments, the seeding process 330 may accept additional user input regarding definitions of the seed regions. For example, the seeding process 330 may display a slice of the delay map, and once the user has chosen a delay threshold, allow the user to manually select (using mouse 218 for example) individual voxels or groups of voxels in that slice and to tag those voxels as seed voxels (belonging to one or more seed regions).

Seeding process 330 proceeds at step 540 by accepting user input as to which seed region is associated with which feeding vessel. User-defined labels (for example, alphanumeric codes, colours etc.) can be applied to each seed region based on anatomical information. For example, as shown in FIG. 6, each of the seed regions 610 is associated with the same feeder vessel (the right middle cerebral artery) and is assigned the same seed label, and accordingly appears in a different colour or pattern to seed regions 620 and 630 which are respectively associated with different respective feeder vessels (the anterior cerebral arteries and the left middle cerebral artery). FIG. 6A schematically depicts the regions 610, 620, 630 overlaid on the brain and each with the same pattern, prior to label application. In FIG. 6B, following seed identification, regions 610 (right MCA) are depicted with cross-hatching at 45 degrees, region 620 (left or right anterior cerebral artery) with cross-hatching at 90 degrees, and region 630 (left MCA) with cross-hatching at −45 degrees.

The result of seeding process 330 is a seed label image 550, having dimensions corresponding to those of the imaging volume, and with an alphanumeric code or other label being assigned to each voxel belonging to one of the seed regions.

Returning to FIG. 3, once the seed regions have been identified, the segmentation process 340 can begin. In the described embodiments, a region-growing method is used.

In the brain, 5 separate seed labels will typically be used. There are seeds for each of 2 posterior cerebral arteries and 2 middle cerebral arteries. A single seed will generally be identified for both anterior cerebral arteries considered together, as these arteries usually cannot be resolved due to their close proximity.

Segmentation process 340 may also include constraining the segmentation by using prior information concerning segregation of regions of the brain. For example, a mask can be defined, identifying each hemisphere of the brain. The region-growing can take place separately for each hemisphere, exploiting the fact that the hemispheres are separated when the seeds are placed distal to the circle of Willis.

Firstly, at step 705, the following parameters are defined:
delay_minimum: the smallest delay value present in voxels belonging to the user-defined seed regions
NOTrecruited: all voxels not in one of the user-defined seed regions
currentThreshold: initial value equal to delay_minimum
seed_labels: numerical codes corresponding to the user-defined seed labels
step_size: 0.015
maximumThreshold: delay_minimum+15

Segmentation process 340 increments currentThreshold by step_size (step 710), and then loops over the set of user-defined seed labels at steps 715 and 735. For each seed label, the process 340 retrieves a list of all voxels which are not already assigned and which have delay values lower than currentThreshold (step 720). Then, these candidate voxels are assessed to determine whether they are directly connected (for example, via 6-connectivity) with a voxel having the current seed label (step 725). If so, they are assigned the current seed label, and the seed label image 550 is updated (step 730). If all seed labels have been looped over then the process 340 checks (step 740) whether maximumThreshold has been reached, and if not, returns to 710 where it increments currentThreshold and iterates over the seed labels once more.

Figure 8:
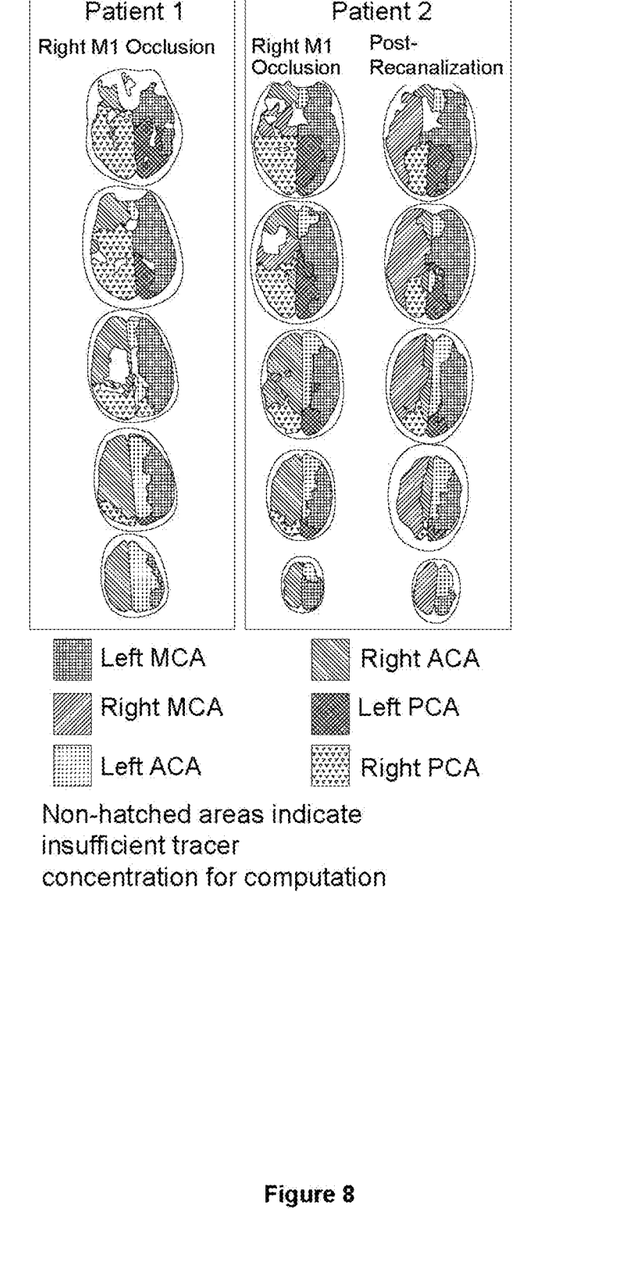
FIG. 8 shows three series of segmented images, through five different brain slices, produced by the segmentation process of FIG. 7.

Once maximumThreshold is reached, the segmentation process 340 terminates and returns a segmented image 750 in which all voxels having a delay value equal to or less than maximumThreshold (apart from any excluded voxels which are identified during the pre-processing 320) are assigned to one of the user-defined seed labels. The segmented image 750 can be visualised by assigning a different colour code to each different seed label, and producing a coloured plot, for example slice-by-slice through the segmented image 750 as shown in FIG. 8.

The particular value maximum threshold as used in the described embodiments has been chosen on the basis of performance on historical data. The applicant has found that delay values are relatively comparable between patients, and that after about 15 seconds of incrementing FM, substantially all voxels will generally be captured. It will be appreciated, though, that the maximum threshold value can be made as large as necessary to capture the range of delay values that would normally be expected.

A fixed step size of 0.015 has been used in the described embodiments, as it has been found that a lower step size increases the processing time without appreciably improving the segmentation results. It will appreciated, though, that a different fixed step size, or a variable step size, may be used. For example, steps could be more closely spaced at low delay values, with the spacing between steps increasing as the delay increases. Alternatively, the empirical distribution of the delay values for a particular image could be sorted from smallest to largest and used as the increments for the iterative process 340 described above.

EXAMPLE

FIG. 8 depicts data from two acute stroke patients (sub 6 h) both with M1 occlusions affecting more than half of the MCA territory and no motion artefact in the perfusion acquisition. Whole brain perfusion CT imaging was performed using a Toshiba Aquilion One CT system, and the image processed in accordance with the process 300 described above. Labels were assigned to each of the 6 feeding vessels and the vascular territory maps were generated. Each voxel is labelled (different labels represented in the Figure by different cross-hatching or other patterning, as shown in the key at bottom) by its dominant source of flow.

Patient 1 had a complete M1 occlusion with no residual flow visible on MRA. The vascular territory maps indicate the right MCA territory supplied mainly by PCA leptomeningeal collaterals caudally and ACA collaterals rostrally. Patient 2 had acute and 24 h imaging. The vascular territory maps show an acute pattern much like patient 1, but returning to an almost completely symmetric distribution between hemispheres at 24 h.

CONCLUSION

Advantageously, embodiments of the post-processing method described herein offer information on vascular supply territories that complements conventional perfusion maps. The method can be applied to previously obtained images from a CT, MRI or other imaging system without the need for additional hardware or re-imaging. With application of the post-processing method 300, visualization and measurement of vascular supply territories using a routine perfusion CT scan becomes possible, this previously having been limited to arterial spin labelling MRI. Embodiments of the post-processing method have the potential to characterise and quantify collateral circulation with no need for additional hardware or longer acquisition times.

The skilled person will appreciate that many modifications and variations of the above embodiments are possible without departing from the scope of the invention as defined in the accompanying claims. Further, individual features or combinations of features from the different embodiments illustrated and described may be construed as independent inventive solutions or solutions proposed in their own right.

The invention claimed is:

1. A computer-implemented method of identifying vascular territories in an imaging volume representing an anatomical region, including:

obtaining, for each volume element of a plurality of volume elements into which the imaging volume is divided, arrival time data representing an estimated arrival time of a contrast agent at the volume element;

defining one or more seed regions, each seed region associated with one of a plurality of vascular territories and containing seed volume elements for which the estimated arrival time does not exceed a threshold time;

identifying, on the basis of the arrival time data, unassigned elements of the plurality of volume elements which are connected with a seed volume element; and assigning said unassigned elements of the plurality of volume elements to one of said vascular territories, assigning includes applying region-growing to said seed region or regions.

2. A computer-implemented method according to claim 1, including assigning a label to each said seed region.

3. A computer-implemented method according to claim 1, wherein said defining includes accepting input data from a user.

4. A computer-implemented method according to claim 1, including:
(i) incrementing the threshold time to obtain an updated threshold;
(ii) identifying unassigned volume elements having estimated arrival times less than the updated threshold;
(iii) assigning said unassigned volume elements to one of said vascular territories; and
(iv) repeating (i) to (iii) until a maximum threshold is reached.

5. A computer-implemented method according to claim 1, including constraining said assigning on the basis of prior information.

6. A computer-implemented method according to claim 5, wherein the prior information includes information relating to segregation of blood flow in the anatomical region.

7. A computer-implemented method according to claim 1, wherein the anatomical region is brain.

8. A computer-implemented method according to claim 1, wherein the arrival time data are derived from CT or MM scans of a subject.

9. A non-transitory computer-readable medium containing computer program instructions which, when executed by at least one processor, cause the at least one processor to perform the method of claim 1.

10. A system for identifying vascular territories in an imaging volume representing an anatomical region, including:
pre-processing means for obtaining, for each volume element of a plurality of volume elements into which the imaging volume is divided, arrival time data representing an estimated arrival time of a contrast agent at the volume element;
seeding means for defining one or more seed regions, each seed region associated with one of a plurality of vascular territories and containing seed volume elements for which the estimated arrival time does not exceed a threshold time;
identifying means for identifying, on the basis of the arrival time data, unassigned elements of the plurality of volume elements which are connected with a seed volume element; and
assigning means for assigning said unassigned elements of the plurality of volume elements to one of said vascular territories, assigning includes applying region-growing to said seed region or regions.

11. A system according to claim 10, wherein the seeding means includes input means for accepting input data from a user to define said one or more seed regions.

12. A system according to claim 10, including means for:
(i) incrementing the threshold time to obtain an updated threshold;
(ii) identifying unassigned volume elements having estimated arrival times less than the updated threshold;
(iii) assigning said unassigned volume elements to one of said vascular territories; and
(iv) repeating (i) to (iii) until a maximum threshold is reached.

13. A system according to claim 10, including means for constraining said assigning on the basis of prior information.

14. A system according to claim 13, wherein the prior information includes information relating to segregation of blood flow in the anatomical region.

15. A system according to claim 10, wherein the anatomical region is brain.

16. A system according to claim 10, including a medical imaging apparatus for obtaining imaging data from a subject, and wherein the arrival time data are derived from the imaging data.

17. A system according to claim 16, wherein the medical imaging apparatus is a CT scanner or MRI scanner.

* * * * *

UNITED STATES PATENT AND TRADEMARK OFFICE
CERTIFICATE OF CORRECTION

PATENT NO. : 9,466,145 B2  
APPLICATION NO. : 14/396871  
DATED : October 11, 2016  
INVENTOR(S) : Soren Christensen Page 1 of 1

It is certified that error appears in the above-identified patent and that said Letters Patent is hereby corrected as shown below:

In the Claims

Column 9, Line 29 In Claim 8, delete "MM" and insert -- MRI --, therefor.

Signed and Sealed this  
Sixth Day of December, 2016

Michelle K. Lee  
*Director of the United States Patent and Trademark Office*